United States Patent
Pio et al.

(10) Patent No.: US 7,345,905 B2
(45) Date of Patent: Mar. 18, 2008

(54) MEMORY DEVICE WITH TIME-SHIFTING BASED EMULATION OF REFERENCE CELLS

(75) Inventors: Federico Pio, Brugherio (IT); Efrem Bolandrina, Fiorano Al Serio (IT); Daniele Vimercati, Carate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 170 days.

(21) Appl. No.: 11/367,707

(22) Filed: Mar. 2, 2006

(65) Prior Publication Data

US 2006/0209594 A1     Sep. 21, 2006

(30) Foreign Application Priority Data

Mar. 3, 2005   (EP)   ................................. 05101660

(51) Int. Cl.
G11C 17/00   (2006.01)
(52) U.S. Cl. .................. 365/100; 365/185.18; 365/194
(58) Field of Classification Search ................ 365/100, 365/185.18, 185.23, 189.08, 194, 241
See application file for complete search history.

(56) References Cited

U.S. PATENT DOCUMENTS

| | | | |
|---|---|---|---|
| 4,495,602 A | 1/1985 | Sheppard | .................... 365/104 |
| 5,903,504 A * | 5/1999 | Chevallier et al. | .......... 365/207 |
| 5,933,366 A | 8/1999 | Yoshikawa | ............. 365/185.03 |
| 6,195,283 B1 * | 2/2001 | Rolandi et al. | ........ 365/185.03 |
| 2004/0257876 A1 | 12/2004 | Vimercati | .............. 365/185.21 |

FOREIGN PATENT DOCUMENTS

| | | |
|---|---|---|
| EP | 1 164 597 A2 | 12/2001 |
| EP | 1 473 732 A1 | 11/2004 |

* cited by examiner

*Primary Examiner*—Anh Phung
*Assistant Examiner*—Dang Nguyen
(74) *Attorney, Agent, or Firm*—Lisa K. Jorgenson; Robert Iannucci; Seed IP Law Group PLLC

(57) ABSTRACT

A memory device includes a plurality of memory cells and a comparison circuit that compares a set of selected memory cells with at least one reference cell having a threshold voltage. The comparison circuit includes a bias circuit that applies a biasing voltage having a substantially monotone time pattern to the selected memory cells and to the at least one reference cell, sense amplifiers that detect the reaching of a comparison current by a cell current of each selected memory cell and by a reference current of each reference cell, a logic unit that determines a condition of each selected memory cell according to a temporal relation of the reaching of the comparison current by the corresponding cell current and by the at least one reference current, and a time shift structure that time shifts at least one of said detections according to at least one predefined interval to emulate the comparison with at least one further reference cell having a further threshold voltage.

27 Claims, 9 Drawing Sheets

MEMORY DEVICE WITH TIME-SHIFTING BASED EMULATION OF REFERENCE CELLS

BACKGROUND OF THE INVENTION

1. Field of the Invention

The present invention relates to the memory field. More specifically, the present invention relates to the reading of memory devices.

2. Description of the Related Art

Memory devices are commonly used to store information (either temporarily or permanently) in a number of applications; for example, in a non-volatile memory device the information is preserved even when a power supply is off. Typically, the memory device includes a matrix of memory cells (for example, consisting of floating gate MOS transistors); each memory cell has a threshold voltage that can be programmed to different levels representing corresponding logical values. Particularly, in a multi-level memory device each cell can take more than two levels (and then store a plurality of bits).

The logical values stored in selected cells of the memory device are read by comparing a current flowing through each memory cell with the currents provided by reference cells having predefined threshold voltages. For this purpose, a suitable biasing voltage is applied to the selected memory cells and to the reference cells.

A particular reading technique is disclosed in US2004/0257876 (the entire disclosure of which is herein incorporated by reference). This document proposes the use of a biasing voltage having a ramp-like time pattern. In this case, the selected memory cells and the reference cells turn on at different times (as soon as the biasing voltage reaches their threshold voltages). The temporal order of the turning on of each memory cell with respect to the ones of the reference cells uniquely identifies the logical value stored therein. In this way, the precision of the reading operation is strongly improved and made independent of most external factors.

Similar considerations apply to a program-verify operation, wherein each selected memory cell is compared with a further reference cell having a threshold voltage slightly higher than the one corresponding to the target logical value (so as to ensure that the memory cell has been brought to the desired condition). A further reference cell (with a threshold voltage slightly lower than the one corresponding to an erased condition) is used during an erase-verify operation to determine whether all the memory cells have been successfully erased. Likewise, a still further reference cell (with a threshold voltage still lower than the one corresponding to the erased condition) is used during a depletion-verify operation to identify any depleted memory cells that have been over-erased to a too low threshold voltage. Moreover, additional reference cells with threshold voltages between the ones of the different logical values and the ones of the corresponding program-verify levels are used during a refresh operation (to restore the correct condition of any memory cells that are drifting towards a lower logical value).

A problem of the memory devices known in the art is the correct setting of the several reference cells. Indeed, the difference between the threshold voltages of each pair of adjacent reference cells must be maintained at a predefined value with a very high accuracy, since any drift reduces a window that is available to discriminate the corresponding conditions of the selected memory cells. This problem is particularly acute for each reference cell used during the read operation and the corresponding reference cell(s) used for reading the selected memory cells with a margin (for example, during the program-verify operation or the refresh operation); indeed, in this case the difference between their threshold voltages is very low (for example, of the order of 50-150 mV).

Therefore, the setting of the reference cells requires a very accurate trimming of the desired threshold voltages. This involves a long test time of the memory device, for example, during an electrical wafer sorting (EWS) process. All of the above has a detrimental impact on the production time of the memory device, and then on its cost.

SUMMARY OF THE INVENTION

One embodiment of the present invention uses available reference cells to emulate further reference cells having different threshold voltages is suggested.

One embodiment of the present invention proposes a memory device including a plurality of memory cells. Means is provided for comparing a set of selected memory cells with one or more reference cells (having predefined threshold voltages). The means for comparing includes means for applying a biasing voltage (having a substantially monotone time pattern) to a set of selected memory cells and to the reference cells. Means is also provided for detecting the reaching of a comparison current by a cell current of each selected memory cell and by a reference current of each reference cell. Moreover, logic means is used for determining a condition of each selected memory cell according to a temporal relation of the reaching of the comparison current by the corresponding cell current and by the reference currents. The means for comparing further includes means for time shifting at least one of said detections according to at least one predefined interval, so as to emulate the comparison with one or more further reference cells having further threshold voltages.

The proposed solution strongly simplifies the setting of the reference cells.

Indeed, it is possible to emulate any reference cell from an available one with a well-defined difference in their threshold voltages; particularly, any inaccuracy of the available reference cell only causes a change in the absolute values of the threshold voltages (of the same reference cell and of the emulated ones), but it is completely immaterial to their differences. In this way, the desired windows for discriminating the different conditions of the memory cells can be defined with a very high degree of precision.

As a result, it is possible to reduce the number of reference cells that are needed with a corresponding simplification of their trimming.

The proposed solution substantially shortens the test of the memory device. This has a beneficial effect on the production time of the memory device and then on its cost.

In a preferred embodiment of the invention, the shifting is applied to the detections relating to the reference currents.

This choice strongly simplifies the implementation of the proposed solution (with respect to the one applied to the detections relating to the cell currents).

In a particular embodiment of the invention, this result is achieved by delaying the provision of a signal (which is asserted in response to the reaching of the comparison current by each reference current) to the logic means.

The proposed structure is very simple.

Alternatively, it is possible to update a value that measures the time required by each reference current to reach the comparison current.

This implementation is very flexible (even if it increases the complexity of the logic means).

In an embodiment of the invention, the shift is disabled during a read operation and it is enabled during one or more read operations with a margin.

The suggested implementation emulates further reference cells that have threshold voltages very close to the ones of the available reference cells; this ensures a high accuracy in these critical situations.

In a different embodiment of the invention, a single reference cell is provided.

Therefore, the advantages of the proposed solution are exploited at their best (at the cost of a reduced accuracy, especially when the threshold voltages of the emulated reference cells are far away from the one of the single reference cell).

In the embodiment of the invention based on the delaying of the signals, the single reference cell has a threshold voltage that is closest to a starting value of the biasing voltage (among the ones required by the memory device).

This makes it possible to emulate all the other reference cells with increasing threshold voltages (in absolute value).

Alternatively, in the embodiment of the invention based on the updating of the measured values, the single reference cell is in an erased condition.

The proposed choice allows setting the threshold voltage of the single reference cell with the highest accuracy.

A way to further improve the solution is to realize the single reference cell with a plurality of basic reference elements (providing basic currents that are combined into the corresponding reference current); in this case, the comparison current and/or the reference current are accordingly scaled for their comparison.

This modular structure reduces the effects of a spread of the threshold voltage of the reference cell (since the differences among the threshold voltages of its basic elements substantially cancel on the average).

Another embodiment of the present invention provides a corresponding method for operating a memory device.

Some features of the present invention are set forth in the appended claims. The invention itself, however, as well as further features and advantages thereof will be best understood by reference to the following detailed description, given purely by way of a non-restrictive indication, to be read in conjunction with the accompanying drawings.

DETAILED DESCRIPTION OF THE INVENTION

Figure 1:
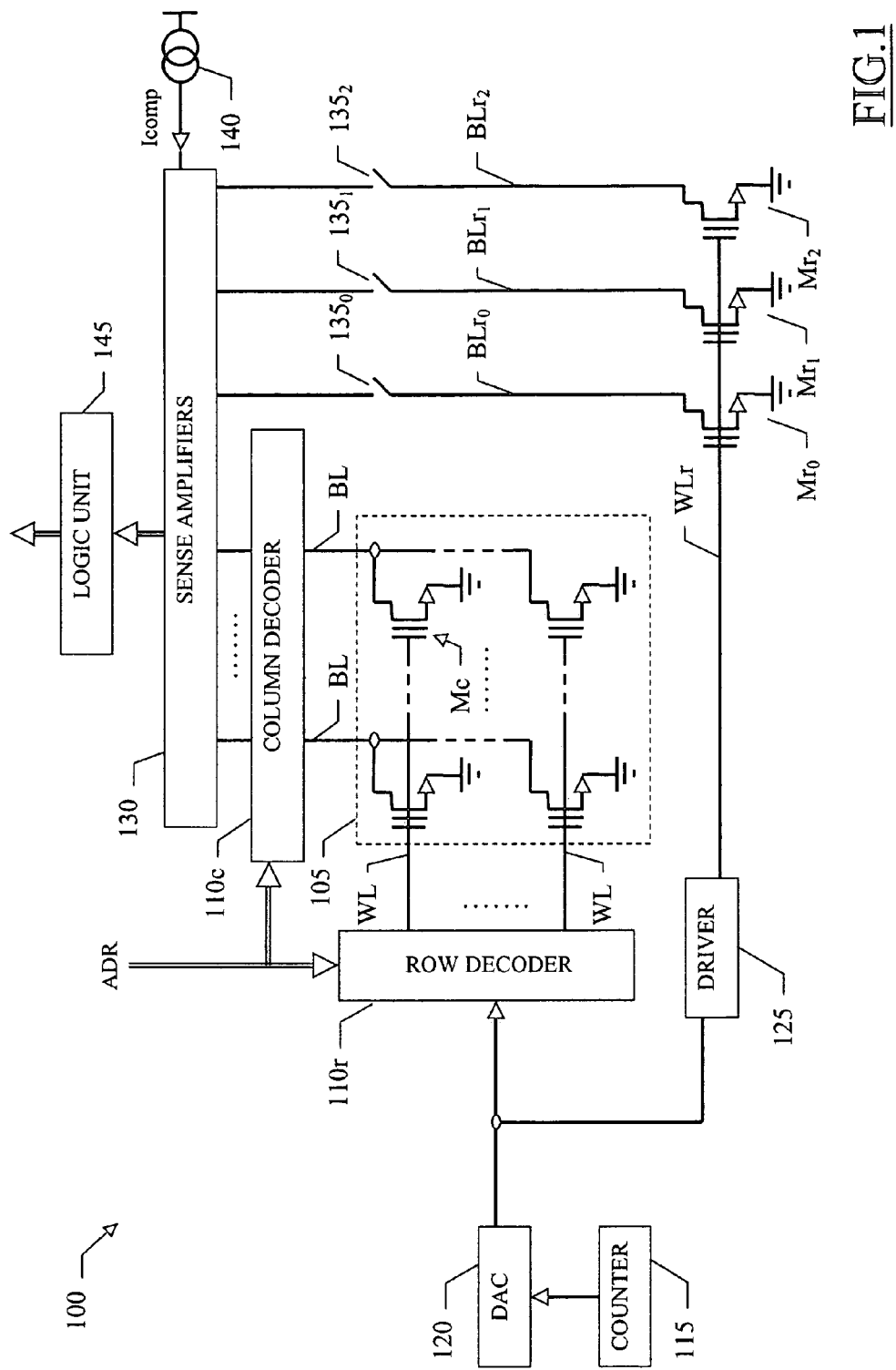
FIG. 1 is a schematic block diagram of a memory device in which the solution according to an embodiment of the invention is applicable.

With reference in particular to FIG. 1, a non-volatile memory device 100 (for example, consisting of a flash $E^2PROM$) is illustrated. The memory device 100 is integrated in a chip of semiconductor material, and includes a matrix 105 of memory cells Mc. Each memory cell Mc includes a floating gate MOS transistor with a programmable threshold voltage Vthc. The memory cell Mc in a non-programmed (or erased) condition exhibits a low threshold voltage. The memory cell Mc is programmed by injecting electric charge into its floating gate; the memory cell Mc can be programmed to multiple levels, each one associated with a corresponding range of its threshold voltage Vthc. Each level represents a different logical value; for example, the memory device 100 operates at 4 levels, so that each memory cell Mc stores a logical value consisting of 2 bits of information (11, 10, 01 and 00 for increasing threshold voltages Vthc).

The matrix 105 includes one or more sectors (only one shown in the figure), which can be erased individually. Each sector is associated with three reference cells $Mr_0$, $Mr_1$ and $Mr_2$ that are used for discriminating the logical values stored in the memory cells Mc. For this purpose, the threshold voltages of the reference cells $Mr_0$, $Mr_1$ and $Mr_2$ (denoted with $Vthr_0$, $Vthr_1$ and $Vthr_2$) are set to predefined values between the levels of the logical values 11-10, 10-01 and 01-00, respectively.

In the example at issue, the matrix 105 has a so-called NOR architecture. Particularly, the drain terminals of the memory cells Mc of each column are connected to a corresponding bit line BL, whereas the control gate terminals of the memory cells Mc of each row are connected to a corresponding word line WL; the source terminals of all the memory cells Mc are connected to a common terminal providing a reference voltage (or ground).

The memory device 100 simultaneously processes a word (for example, consisting of 16 bits). The bits of each word are stored in a page of memory cells Mc (16/2=8 in the example at issue), which are associated with a single word line WL; the bit lines BL of the matrix 105 are grouped into 8 sub-sets, each one for a memory cell Mc of the different pages.

Likewise, the drain terminals of the reference cells $Mr_0$, $Mr_1$ and $Mr_2$ are connected to a bit line $BLr_0$, $BLr_1$ and $BLr_2$, respectively. The control gate terminals of all the reference cells $Mr_0$-$Mr_2$ are connected to a common word line WLr, whereas their source terminals are connected to the ground terminal.

The memory device 100 receives an address ADR for accessing a corresponding page. A portion of the address ADR is supplied to a row decoder 110r, which selects the desired word line WL. Another portion of the address ADR is supplied to a column decoder 110c, which selects the desired bit line BL in each sub-set. The memory device 100 further includes a counter 115, which is continuously incremented with a predefined frequency (after being reset at the beginning of every operation on the memory device 100); the value in the counter 115 is supplied to a digital-to-analog converter (DAC) 120, which outputs a biasing voltage having a ramp-like pattern (i.e., with its value that increases linearly over time according to a constant slope). The row decoder 110r couples the selected word line WL with the DAC 120, so as to apply the biasing voltage to the control gate terminals of the selected memory cells Mc. The same biasing voltage is also applied to the word line WLr (and then to the control gate terminals of the reference cells $Mr_0$-$Mr_2$) through a driver 125.

The column decoder 110c connects the selected bit lines BL to a bank of sense amplifiers 130. The sense amplifiers 130 are also connected to the bit lines $BLr_0$, $BLr_1$ and $BLr_2$ through switches $135_0$, $135_1$ and $135_2$, respectively. Moreover, the sense amplifiers 130 receive a comparison current Icomp; the comparison current Icomp is provided by a direct current generator 140, and has a value lower than the current flowing through every (memory or reference) cell Mc,$Mr_0$-$Mr_2$ when conductive (for example, about 5-20 μA). As described in detail in the following, the sense amplifiers 130 compare the currents provided by the selected memory cells Mc and by the reference cells $Mr_0$-$Mr_2$ with the current Icomp, so as to detect their turning on. This information is supplied to a logic unit 145, which determines the condition of each selected memory cell Mc according to the temporal relation of the relevant turning on times.

Figure 2A:
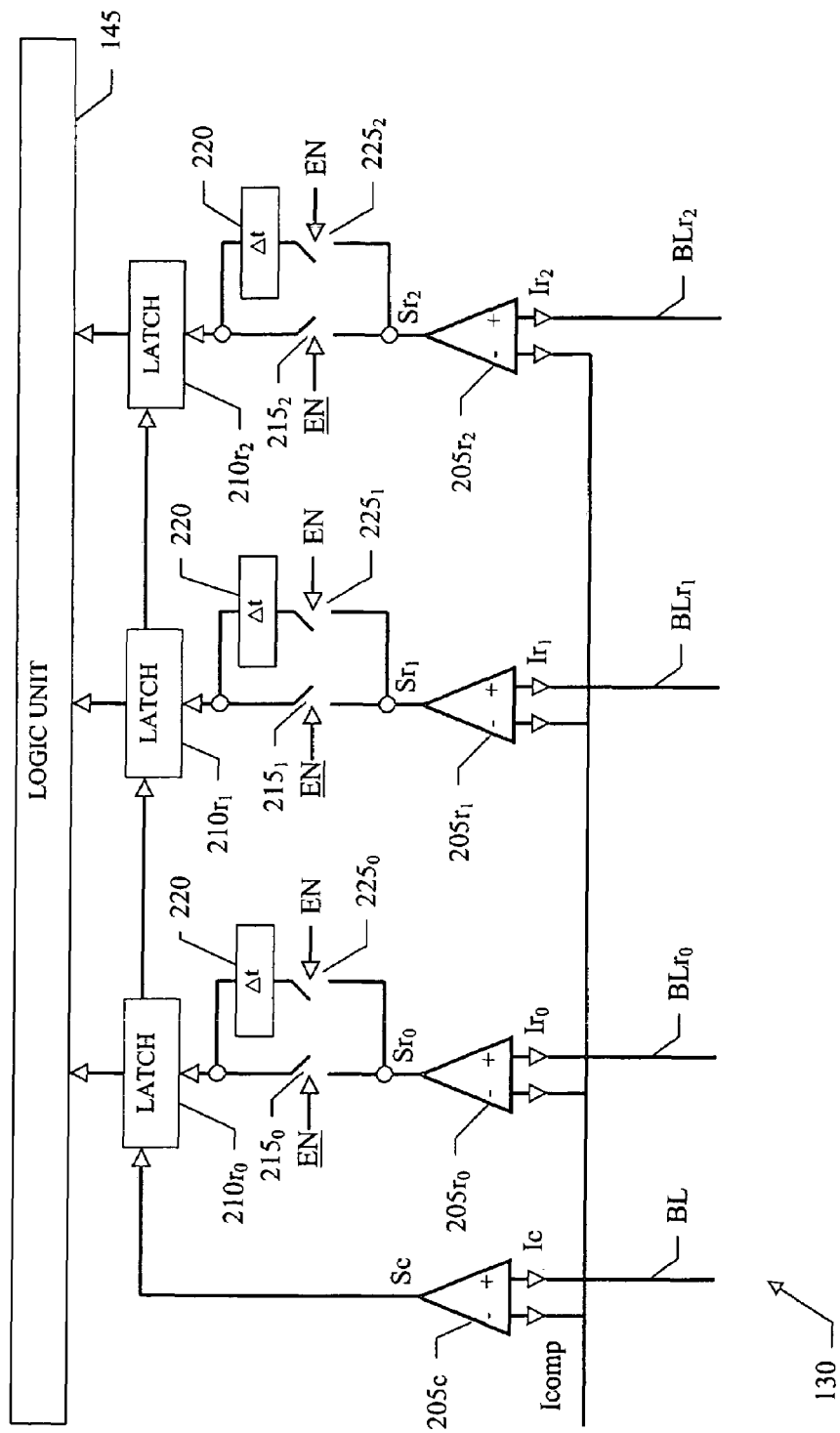
FIG. 2a details a sense amplifier of the memory device according to an embodiment of the invention.

Considering now FIG. 2a, in an embodiment of the invention the sense amplifiers 130 include the same structure for each selected memory cell; particularly, this structure is formed by a comparator 205c for the memory cell and three comparators $205r_0$, $205r_1$ and $205r_2$ for the reference cells. Particularly, the non-inverting input terminal of the comparator 205c receives a cell current Ic flowing through the selected bit line BL (and then through the selected memory cell); on the other hand, the non-inverting input terminals of the comparators $205r_0$, $205r_1$, and $205r_2$ receive a reference current $Ir_0$, $Ir_1$ and $Ir_2$ flowing through the bit lines $BLr_0$, $BLr_1$ and $BLr_2$, respectively (and then through the corresponding reference cells). The inverting input terminals of all the comparators 205c,$205r_0$-$205r_2$ instead receive the comparison current Icomp.

The output terminals of the comparators 205c, $205r_0$, $205r_1$ and $205r_2$ provide a bit Sc, $Sr_0$, $Sr_1$ and $Sr_2$, respectively; the bits Sc,$Sr_0$-$Sr_2$ are asserted (for example, at the logical value 1) when the corresponding currents Ic,$Ir_0$-$Ir_2$ exceed the comparison current Icomp. The output terminals of the comparators $205r_0$, $205r_1$ and $205r_2$ are connected to corresponding latches $210r_0$, $210r_1$, and $210r_2$ through switches $215_0$, $215_1$ and $215_2$, respectively. Alternatively, the same output terminals are connected to the latches $210r_0$, $210r_1$ and $210r_2$ by means of identical delay blocks 220 through further switches $225_0$, $225_1$ and $225_2$, respectively. The blocks 220 delay the application of the bits $Sr_0$-$Sr_2$ to the latches $210r_0$-$210r_2$ by a predetermined value <t; preferably, trimming elements (not shown in the figure) are used to regulate the delay <t to the desired value. For example, the delay <t can be of about 0.2-2 ns; as it will be apparent in the following, this value corresponds to a voltage difference along the ramp of the biasing voltage of 20-200 mV (assuming a slope of $100*10^6$ V/s). All the switches $225_0$-$225_2$ are controlled by an enabling signal EN, while all the switches $215_0$-$215_2$ are controlled by its negated value $\overline{EN}$. On the other hand, the latches $210r_0$-$210r_2$ are controlled by the bit Sc provided by the comparator 205c. The bits $Sr_0$-$Sr_2$ stored in the latches $210r_0$-$210r_2$ are then supplied to the logic unit 145.

Figure 2B:
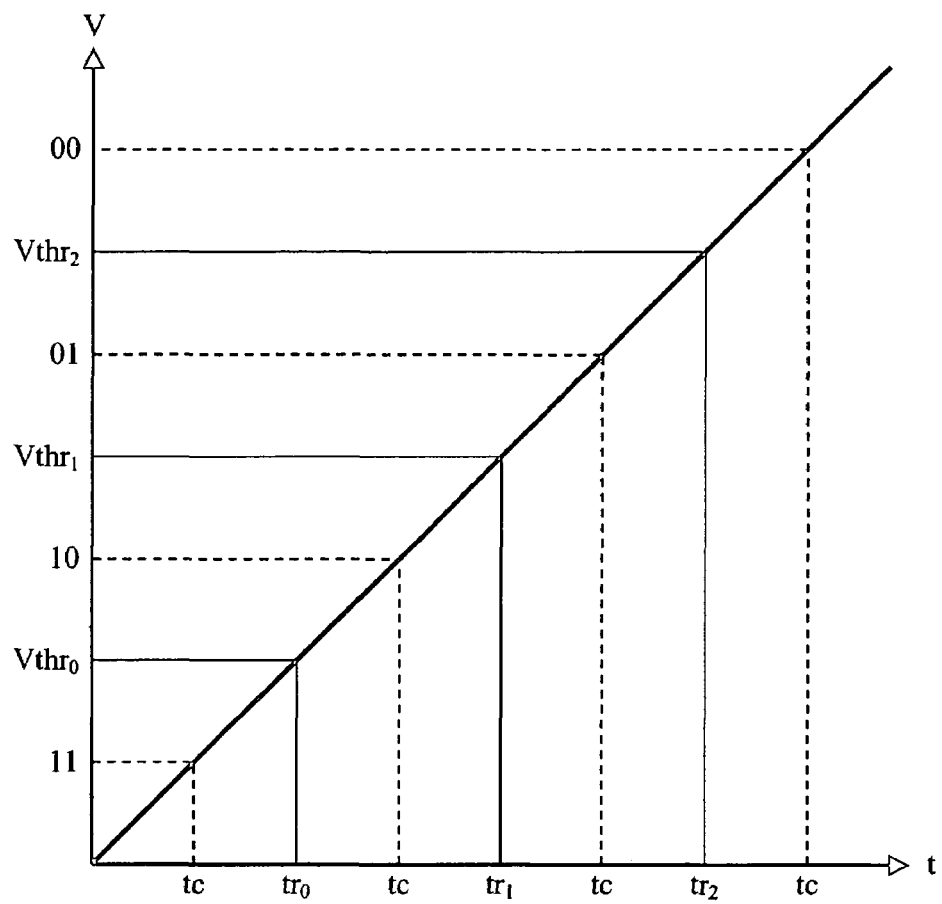
FIGS. 2b and 2c are exemplary time diagrams explaining operation of the sense amplifier.

Considering now FIGS. 2a and 2b together, the biasing voltage (V) increases over time (t) from the value 0V to a maximum value higher than the threshold voltage $Vthr_2$ (of the last reference cell).

During a read operation, the enabling signal EN is deasserted; therefore, the switches $215_0$-$215_2$ are closed and the switches $225_0$-$225_2$ are open. In this condition, when the biasing voltage reaches the threshold voltage $Vthr_0$ at the time $tr_0$, the first reference cell turns on; therefore, as soon as the corresponding reference current $Ir_0$ reaches the comparison current Icomp, its bit $Sr_0$ is asserted. The other bits $Sr_1$ and $Sr_2$ are asserted in succession when the biasing voltage reaches the threshold voltage $Vthr_1$ at the time $tr_1$ and the threshold voltage $Vthr_2$ at the time $tr_2$, respectively.

Likewise, the bit Sc is asserted when the biasing voltage reaches the threshold voltage Vthc of the memory cell to be read at the time tc. As a result, the current values of the bits $Sr_0$-$Sr_2$ are stored into the corresponding latches $210r_0$-$210r_2$; the conditions of the latches $210r_0$-$210r_2$ when the bit Sc is asserted uniquely identify the logical value stored in the memory cell. Particularly, if the time tc precedes the time $tr_0$ all the values in the latches $210r_0$-$210r_2$ are deasserted; this means that the threshold voltage Vthc is lower than the threshold voltage $Vthr_0$ and the memory cell stores the logical value 11. In a similar manner, if the time tc is comprised between the times $tr_0$-$tr_1$ (value in the latch $210r_0$ asserted and values in the latches $210r_1$-$210r_2$ deasserted) or the times $tr_1$-$tr_2$ (values in the latches $210r_0$-$210r_1$ asserted and value in the latch $210r_2$ deasserted) the memory cell stores the logical values 10 or 01, respectively. If the time tc follows the time $tr_2$ (all the values in the latches $210r_0$-$210r_2$ asserted) or the bit Sc is not asserted when the biasing voltage reaches its maximum value (higher than the threshold voltage $Vthr_2$), the memory cell stores the logical value 00. It should be noted that once the bit Sc has switched (and the values of the bits $Sr_0$-$Sr_2$ have been stored into the corresponding latches $210r_0$-$210r_2$), the memory and reference cells can be turned off by means of the column decoder and the associated switches, respectively (so as to reduce the power consumption of the memory device and any noise caused by the current drained from the common ground terminal). Similar considerations apply if the bit Sr is stored into all the latches $210r_0$-$210r_2$ in response to the respective bits $Sr_0$-$Sr_2$.

Figure 2C:
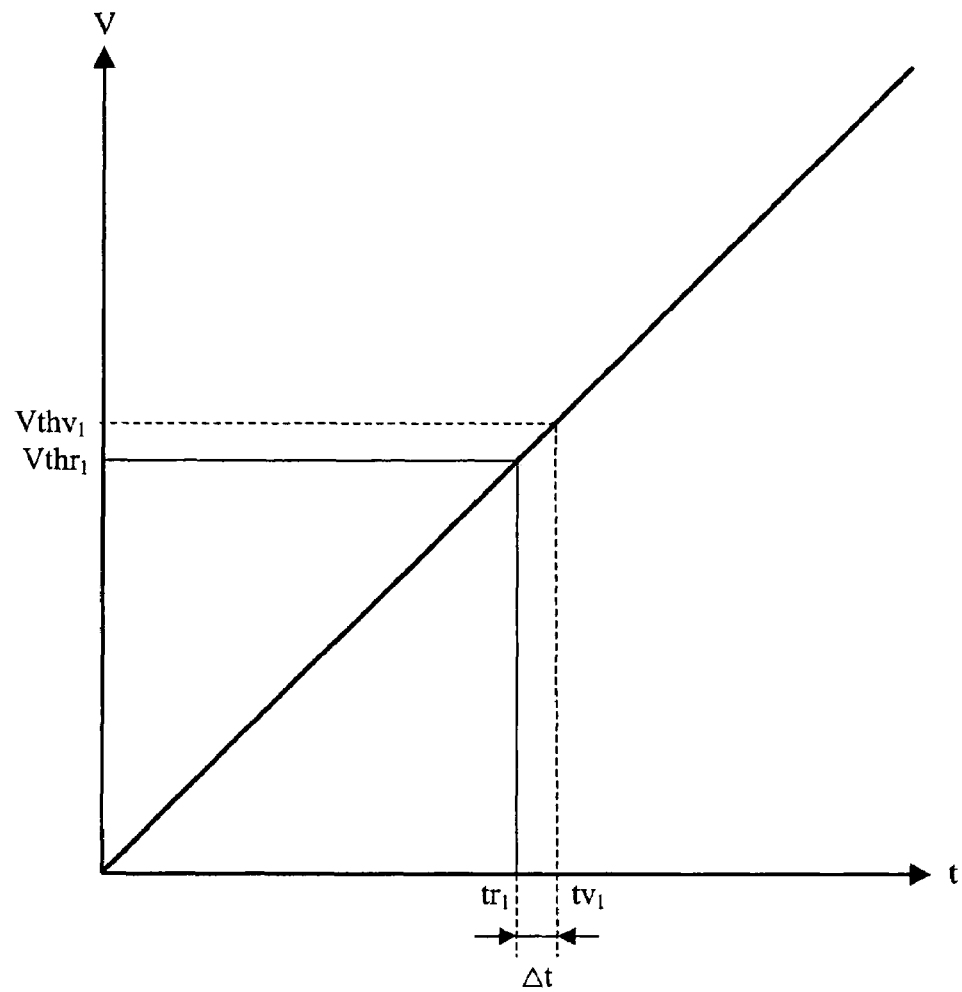

With reference instead to FIG. 2a with FIG. 2c, let us consider a program-verify operation relating to a specific logical value (for example, the one corresponding to the reference cell with the threshold voltage $Vthr_1$). In this condition, only this reference cell is taken into consideration; at the same time, the enabling signal EN is now asserted, so that the switch $225_1$ is closed and the switch $215_1$ is open. As in the preceding case, the bit $Sr_1$ is asserted at the time $tr_1$ when the biasing voltage reaches the threshold voltage $Vthr_1$.

However, the bit $Sr_1$ now reaches the latch $210r_1$ after the delay <t introduced by the block 220. The assertion of the bit $Sr_1$ can thus be stored into the latch $210r_1$ (in response to the bit Sc) only after the time $tv_1$=$tr_1$+<t. As clearly shown in the figure, this delay <t is equivalent to a corresponding increase of the threshold voltage of the reference cell; therefore, the (delayed) bit $Sr_1$ emulates a further reference cell with a different threshold voltage (denoted with $Vthv_1$); particularly, the threshold voltage $Vthv_1$ is equal to the threshold voltage $Vthr_1$ with a margin that is always positive.

Figure 3:
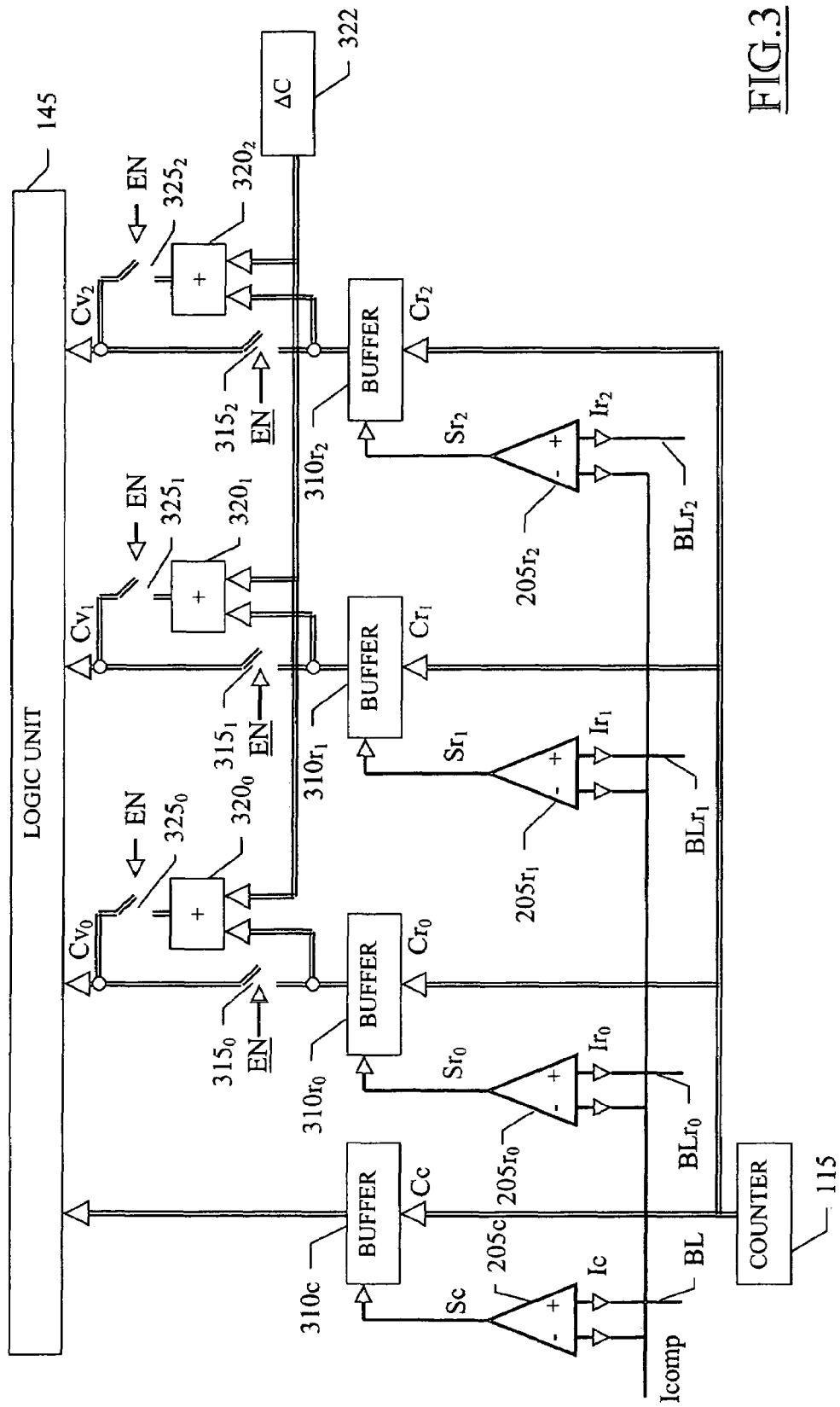
FIG. 3 details the same sense amplifier according to a further embodiment of the invention.

A different embodiment of the invention is illustrated in FIG. 3 (in the following, the elements corresponding to the ones shown in the preceding figures will be denoted with the same references and their explanation will be omitted for the sake of brevity). In this case, the value in the counter 115 (which is used to generate the ramp-like biasing voltage) is supplied to a buffer 310c for each selected memory cell (only one shown in the figure) and to three buffers $310r_0$, $310r_1$ and $310r_2$ for the reference cells. The bit Sc enables the buffer 310c to store the value in the counter 115; the bits $Sr_0$-$Sr_2$ control the corresponding buffers $310r_0$-$310r_2$ in a similar way.

The buffer 310c is directly connected to the logic unit 145. On the other hand, the buffers $310r_0$, $310r_1$ and $310r_2$ are connected to the logic unit 145 through switches $315_0$, $315_1$ and $315_2$, respectively. The same buffers $310r_0$, $310r_1$ and $310r_2$ are also connected to an input terminal of corresponding adders $320r_0$, $320r_1$ and $320r_2$; another input terminal of the adders $320r_0$-$320r_2$ receives an offset <C from a common register 322, which offset <C can be customized to the desired value (either positive or negative). The adders $320r_0$, $320r_1$ and $320r_2$ are connected to the logic unit 145 through further switches $325_0$, $325_1$ and $325_2$, respectively. All the switches $325_i$ are controlled by the same enabling signal EN, while all the switches $315_i$ are controlled by its negated value $\overline{EN}$.

As in the preceding case, during a read operation the enabling signal EN is deasserted; therefore, the switches $315_i$ are closed and the switches $325_i$ are open. In this condition, when the bits $Sr_0$, $Sr_1$ and $Sr_2$ are asserted at the times $tr_0$, $tr_1$ and $tr_2$, respectively, the corresponding values in the counter 115 (denoted with $Cr_0$, $Cr_1$ and $Cr_2$) are stored into the buffers $310r_0$, $310r_1$ and $310r_2$, respectively. Likewise, when the bit Sc is asserted at the time tc the corresponding value in the counter 155 (denoted with Cc) is stored into the buffer 310c. Therefore, if the value Cc is lower than the value $Cr_0$, the memory cell stores the logical value 11, if the value Cc is comprised between the values $Cr_0$-$Cr_1$ or $Cr_1$-$Cr_2$ the memory cell stores the logical values 10 or 01, respectively, and if the value Cc is higher than the value $Cr_2$ the memory cell stores the logical value 00.

Conversely, during a program-verify operation (relating to the same reference cell as in the preceding case) the enabling signal EN is asserted, so that the switch $225_i$ is close and the switch $215_i$ is open. In this case, the value $Cr_1$ that is stored in the buffer $310r_1$ is now updated (i.e., increased or decreased) according to the offset <C. Therefore, the logic unit 145 will receive a value $Cv_1 = Cr_1 + <C$. This offset <C is equivalent to a corresponding change in the threshold voltage of the reference cell (i.e., an increase for a positive offset <C or a decrease for a negative offset <C); it should be noted that in this embodiment it is now possible to emulate a further reference cell having a threshold voltage with either a positive margin or a negative margin.

Figure 4:
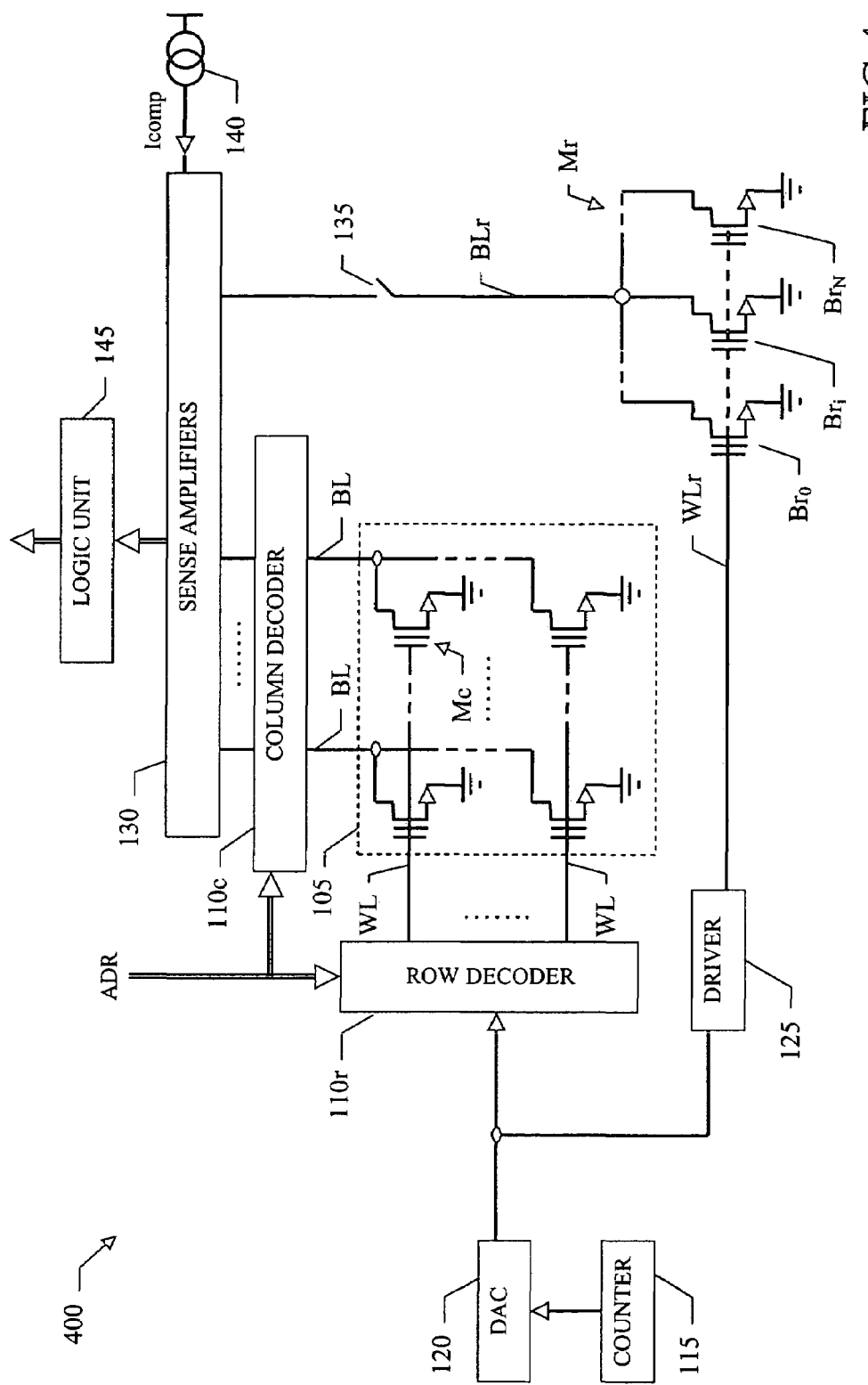
FIG. 4 is a schematic block diagram of a different memory device in which the solution according to another embodiment of the invention is applicable.

As shown in FIG. 4, a memory device 400 according to a different embodiment of the invention is illustrated. In this case, each sector of the memory device 400 is associated with a structure being equivalent to a single reference cell (denoted with Mr). The reference cell Mr includes multiple basic elements $Br_i$ (with i=0 . . . N, for example, N=3-10), each one consisting of a floating gate MOS transistor. The drain terminals of the basic elements $Br_i$ are connected to a common bit line BLr (which is coupled with the sense amplifiers 130 through a switch 135). The control gate terminals of all the basic elements $Br_i$ are connected to the word line WLr, whereas their source terminals are connected to the ground terminal.

Figure 5A:
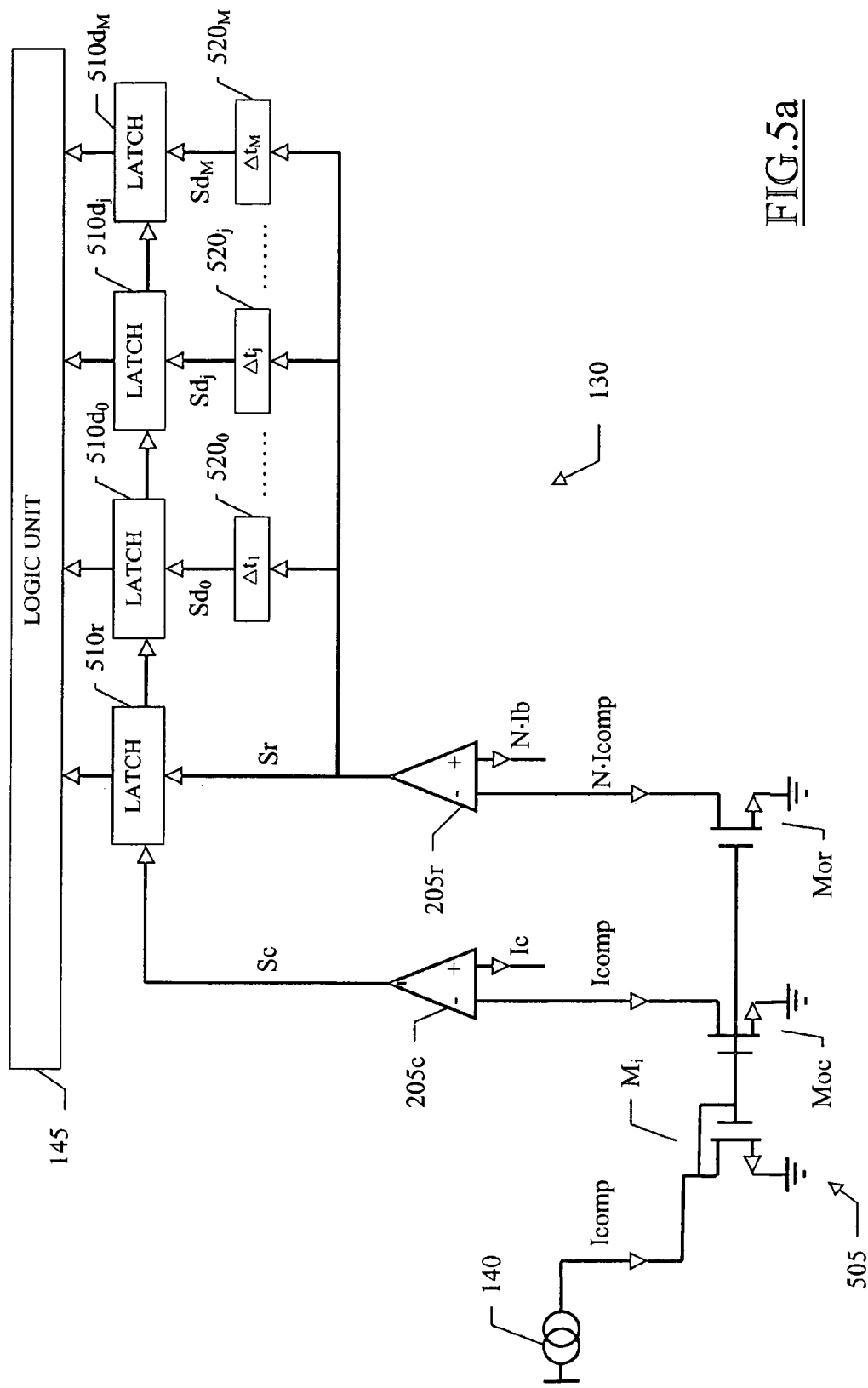
FIG. 5a details a sense amplifier of that memory device according to an embodiment of the invention.

Considering now FIG. 5a, in an embodiment of the invention based on the delays, each basic element of the reference cell is set to the lowest threshold voltage (denoted with Vthr) that is required for the operation of the memory device; typically, the threshold voltage Vthr consists of the value that is used during a depletion-verify operation (for example, 0-2V). For each selected memory cell, the sense amplifiers 130 now include a single comparator 205r for the reference cell (in addition to the comparator 205c for the memory cell). Particularly, the non-inverting input terminal of the comparator 205r receives a reference current flowing through the bit line BLr (and then through the reference cell). The reference current is given by the sum of the currents that flow through the corresponding basic elements; denoting with Ib the common value of these basic currents, the reference current is then equal to N*Ib.

Moreover, the comparison current Icomp is now provided to the sense amplifiers 130 through a current mirror 505. The current mirror 505 includes an input leg that is formed by an NMOS transistor Mi. The transistor Mi has the drain terminal connected to the current generator 140 (for receiving the comparison current Icomp); the transistor Mi has the gate terminal short-circuited to its drain terminal, and the source terminal connected to the ground terminal.

For each selected memory cell, the current mirror 505 further includes a cell output leg (for the memory cell) and a reference output leg (for the reference cell). Particularly, the cell output leg and the reference output leg are formed by an NMOS transistor Moc and an NMOS transistor Mor, respectively. The transistors Moc,Mor have the gate terminals connected to the gate terminal of the transistor Mi and the source terminals connected to the ground terminal. The drain terminal of the transistor Moc is connected to the inverting input terminal of the comparator 205c, and the drain terminal of the transistor Mor is connected to the inverting input terminal of the comparator 205r.

The transistors Mi and Moc are dimensioned so that a mirroring factor between the input leg and the cell output leg is equal to 1. Therefore, the comparator 205c will receive the same comparison current Icomp. Conversely, the transistors Mi and Mor are dimensioned so that a mirroring factor between the input leg and the reference output leg is equal to N. Therefore, the comparator 205r will receive a multiplied comparison current equal to N*Icomp.

The output terminal of the comparator 205r is now connected to multiples latches. Particularly, the output terminal of the comparator 205r, providing a bit Sr, is directly connected to a latch 510r. The same output terminal is instead connected to further latches $510d_j$ (with j=0 . . . M, for example, M=2-15) through corresponding delay blocks $520_j$. Each delay block $520_j$ applies a corresponding bit $Sd_j$ to the latch 510dj. The bit $Sd_j$ is delayed with respect to the bit Sr by a value $<t_j$; preferably, the delays $<t_j$ can be trimmed to the desired values either individually or as a whole (for example, proportionally to their values). For example, the delays $<t_j$ can be in the range from 0.2 ns to 60 ns, for a voltage difference along the ramp of the biasing voltage between 20 mV and 6V (again assuming a slope of $100*10^6$ V/s of the ramp). As in the preceding case, all the latches 510r,510dj are controlled by the bit Sc provided by the comparator 205c.

Figure 5B:
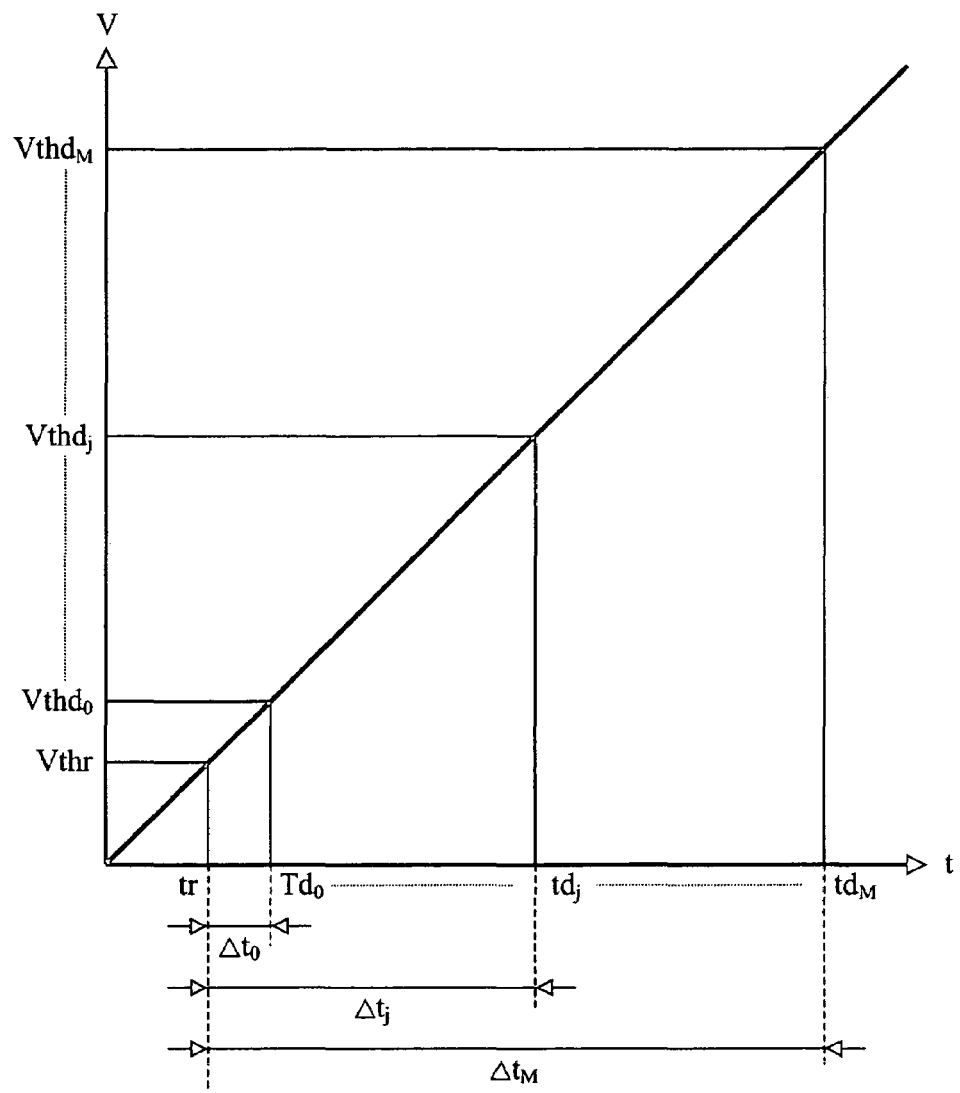
FIG. 5b is an exemplary time diagram explaining operation of the sense amplifier.

Considering now FIGS. 5a and 5b together, when the biasing voltage reaches the threshold voltage Vthr at the time tr, the basic elements of the reference cell turn on; therefore, as soon as the corresponding reference current N*Ib reaches the multiplied comparison current N*Icomp, the bit Sr is asserted. The other bits $Sd_j$ are asserted in succession at the times $td_j = tr + <t_j$. When the bit Sc is asserted, the current values of the bits Sr,$Sd_j$ are stored into the corresponding latches 510r,$510d_j$. As clearly shown in the figure, each delay $<t_j$ is then equivalent to a corresponding increase of the threshold voltage of the reference cell. Therefore, the (delayed) bits $Sd_j$ emulate further reference cells with different threshold voltages (denoted with $Vthd_j$). The threshold voltages $Vthd_j$ can be set to any desired value higher than Vthr (for example, for the erase-verify operation, the read operation, the program-verify operation, and the refresh operation); naturally, the logic unit of the memory device will exploit one or more of the available bits $Sr, Sd_j$ at any time, according to the operation in progress.

Figure 6:
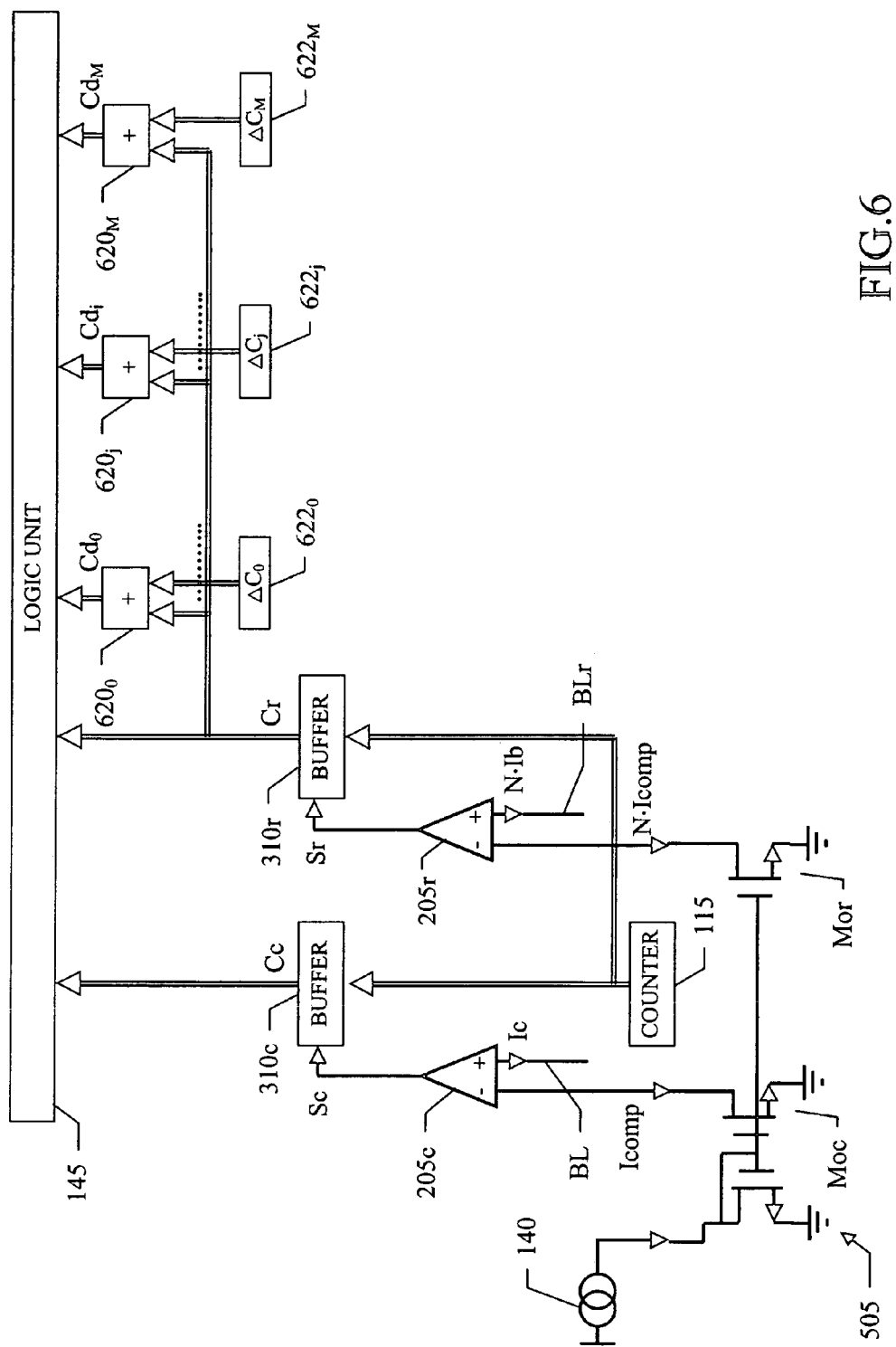
FIG. 6 details the same sense amplifier according to a further embodiment of the invention.

With reference instead to FIG. 6, in a different embodiment of the invention based on the offsets, each basic element of the single reference cell is preferably in the erased, or ultra-violet (UV), condition (i.e., without any charge in its floating gate and then with a threshold voltage of about 3.0-4.0 V). The sense amplifiers 130 now include a single buffer 310r for the reference cell (in addition to the buffer 310c for each selected memory cell); the bit Sr (provided by the comparator 205r) enables the buffer 310r to store the value in the counter 115 (while the bit Sc controls the buffer 310c as above).

Both the buffer 310c (providing the value Cc) and the buffer 310r (providing a value denoted with Cr) are directly connected to the logic unit 145. The buffer 310r is also connected to an input terminal of a plurality of adders $620j$; another input terminal of each adder $620_j$ receives an offset $<C_j$ from a corresponding register $622_j$, which offset $<C_j$ can be customized to the desired value (either positive or negative). Each adder $620_j$ supplies a corresponding value $Cd_j=Cr+<C_j$ to the logic unit 145.

As in the preceding case, as soon as the bit Sr is asserted (when the biasing voltage reaches the threshold voltage of the basic elements of the reference cell), the corresponding value Cr in the counter 115 is stored into the buffers 310r. At the same time, the adders $620j$ calculate the other values $Cd_j$ by adding the respective offsets $<C_j$ to the value Cr. The values $Cd_j$ are equivalent to corresponding increments or decrements of the threshold voltage of the reference cell; therefore, they emulate further reference cells with different threshold voltages (which are selectively exploited by the logic unit of the memory device according to the operation in progress).

Modifications

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components. In addition, the application of the proposed solution to different non-volatile memory devices (such as $E^2PROMs$, flash memories with NAND architecture, phase-change memories), or even to other memory devices (such as DRAMs) is contemplated; in any case, the principles of the invention should not be limited to a multi-level memory device (but they also apply to standard memory devices wherein each memory cell stores a single bit).

Moreover, the numerical examples described above are merely illustrative and must not be interpreted in a limitative manner.

Alternatively, the ramp-like biasing voltage can be generated in another way (for example, by means of an analog generator or by applying a direct current to the selected memory cells and to the reference cells); similar considerations apply if the biasing voltage has a different monotone time pattern (either increasing or decreasing over time).

Alternatively, the values stored in the memory cells can be determined with equivalent techniques based on the temporal order of their turning on with respect to the ones of the reference cells (for example, with a single latch for each reference cell and the addition of a further latch for each memory cell).

In any case, the solution according to the present invention lends itself to be implemented with any equivalent means for delaying the provision of the relevant bit(s) to the logic unit.

In a different embodiment of the invention, the time required by the reference current(s) to reach the comparison current is measured in a different way (for example, by using a dedicated counter controlled by an oscillator, which counter is reset at the enabling of the ramp generator); moreover, the adder(s) can be replaced with an equivalent structure (for example, by implementing the same operations in the logic unit directly).

In both cases, different delays/offsets can be provided for each reference cell (even with those delays/offsets that are set dynamically to different values according to the desired reference thresholds); in this way, for example, it is possible to compensate any intrinsic difference among the sense amplifiers (such as due to any asymmetry in the routing of the corresponding signals).

The enabling/disabling of the proposed structure with equivalent solutions is contemplated. Moreover, the above-described implementations of the invention based on a single delay/offset for each reference cell are also applicable to a refresh-operation, or more generally to any other read operation with a (positive and/or negative) margin.

Similar considerations apply when the basic elements of the single reference cell are set to a different threshold voltage. Particularly, in the embodiment based on the delays the threshold voltage can consist of the value that is used during the erase-verify operation, or more generally to the required threshold voltage (either the lowest one or the highest one) that is closest to a starting value of the biasing voltage.

Without departing from the principles of the invention, the basic currents can be combined in a different way into the corresponding reference current; likewise, alternative solutions are tenable for scaling the reference current and/or the comparison current in order to allow their comparison (for example, by diving the reference current instead of multiplying the comparison current).

Moreover, it will be apparent to those skilled in the art that the additional features providing further advantages are not essential for carrying out the invention, and may be omitted or replaced with different features.

For example, the application of the proposed solution to the cell currents is not excluded (even if this implementation is less advantageous, since it requires the replica of the same structure for the number of memory cells that are processed simultaneously).

In any case, the principles of the invention should not be limited to the above-described embodiments based on the delays and on the offsets; more generally, it is possible to use any suitable means for time shifting the detections (of the reaching of the comparison current by the reference currents) to emulate the comparison with one or more further reference cells.

Moreover, it is possible to emulate any other reference cell from the ones relating to the read operation (such as the reference cells for the depletion-verify and/or the erase-verify operation from the one relating to the logical value 11).

In a different embodiment of the invention, all of the reference cells of the memory device are emulated from two or more reference cells available (either in the solution based on the delays or in the solution based on the offsets); for example, it is possible to have a reference cell with the lowest threshold voltage (for example, 2V) and another reference cell with the highest threshold voltage (for example, 6V) for operation of the memory device.

Alternatively, the setting of the threshold voltage of the single reference cell to the value corresponding to any other operation is contemplated.

At the end, nothing prevents the implementation of the single reference cell with one transistor only.

The invention claimed is:

1. A memory device, comprising:
   a plurality of memory cells; and
   means for comparing a set of selected ones of the memory cells with at least one reference cell having a threshold voltage, the means for comparing including:
     means for applying a biasing voltage to the selected memory cells and to the at least one reference cell;
     means for detecting the reaching of a comparison current by a cell current of each selected memory cell and by a reference current of each reference cell;
     logic means for determining a condition of each selected memory cell according to a temporal relation of the reaching of the comparison current by the corresponding cell current and by the at least one reference current; and
     means for time shifting at least one of said detections according to at least one interval to emulate a comparison with at least one further reference cell having a further threshold voltage.

2. The memory device according to claim 1, wherein the means for time shifting is effective to shift the detection of the reaching of the comparison current by each reference current.

3. The memory device according to claim 2, wherein the means for detecting includes means for asserting respective signals in response to the reaching of the comparison current by each reference current and means for providing each signal to the logic means, the means for time shifting including means for delaying the provision of each signal to the logic means by the at least one interval.

4. The memory device according to claim 2, wherein the means for detecting includes means for measuring a value indicative of a time taken by each reference current to reach the comparison current, the means for time shifting including means for updating each value by at least one offset corresponding to the at least one interval.

5. The memory device according to claim 1, further comprising means for disabling the means for time shifting during a read operation of the selected memory cells and for enabling the means for time shifting during at least one read operation within a margin of the selected memory cells.

6. The memory device according to claim 1, wherein the at least one reference cell consists of a single reference cell.

7. The memory device according to claim 6, wherein the single reference cell has a selected threshold voltage of a plurality of threshold voltages used in accessing the memory device, the selected threshold voltage being closest to a starting value of the biasing voltage.

8. The memory device according to claim 6, wherein the single reference cell is in an erased condition.

9. The memory device according to claim 6, wherein the single reference cell includes a plurality of basic reference elements each providing a corresponding basic current, the means for detecting further including means for combining the basic currents into the corresponding reference current and means for scaling at least one between the comparison current and the reference current.

10. A method for operating a memory device including a plurality of memory cells, the method comprising:
    comparing a set of selected memory cells with at least one reference cell having a threshold voltage, the step of comparing including:
    applying a biasing voltage to a set of selected memory cells and to the at least one reference cell;
    detecting the reaching of a comparison current by a cell current of each selected memory cell and by a reference current of each reference cell;
    determining a condition of each selected memory cell according to a temporal relation of the reaching of the comparison current by the corresponding cell current and by the at least one reference current; and
    time shifting at least one of said detections according to at least one interval to emulate a comparison with at least one further reference cell having a further threshold voltage.

11. The method of claim 10, wherein the time shifting step shifts the detection of the reaching of the comparison current by each reference current.

12. The method of claim 10, wherein the detecting includes asserting respective signals in response to the reaching of the comparison current by each reference current and providing each signal to a logic unit that performs the determining step, the time shifting including delaying the provision of each signal to the logic unit by the at least one interval.

13. The method of claim 10, wherein the detecting includes measuring a value indicative of a time taken by each reference current to reach the comparison current, the time shifting including updating each value by at least one offset corresponding to the at least one interval.

14. The method of claim 10, further comprising disabling the time shifting step during a read operation of the selected memory cells and enabling the time shifting step during at least one read operation within a margin of the selected memory cells.

15. The method of claim 10, wherein the at least one reference cell consists of a single reference cell, wherein the single reference cell includes a plurality of basic reference elements each providing a corresponding basic current, the basic currents being combined into the corresponding reference current, wherein the detecting step includes scaling at least one between the comparison current and the reference current.

16. A method of determining a logic value of a selected memory cell, comprising:
    modifying a current-conduction state of the selected memory cell at a first instant by biasing the selected memory cell;
    modifying a current-conduction state of a reference memory cell at a second instant by biasing the reference memory cell;
    producing first and second signals indicative of the first and second instants, respectively;
    time-shifting one of the first and second signals to produce a time-shifted signal; and
    determining the logic value of the selected memory cell based on a temporal relation between the time-shifted signal and one of the first and second signals that was not time-shifted in the time-shifting step.

17. The method of claim 16 wherein the producing step includes:
 producing the first signal by comparing a cell current of the selected memory cell with a comparison current; and
 producing the second signal by comparing a cell current of the reference memory cell with the comparison current.

18. The method of claim 16 wherein biasing the selected memory cell includes applying a biasing voltage ramp to the selected memory cell and biasing the reference memory cell includes applying the biasing voltage ramp to the reference memory cell.

19. The method of claim 16 wherein the time-shifting step includes inputting the one of the first and second signals being time-shifted into a delay unit that outputs the time-shifted signal.

20. The method of claim 16 wherein the first and second signals are digital signals and the time-shifting step includes adding a digital offset value to the one of the first and second signals being time-shifted.

21. The method of claim 20 wherein the digital offset value is a positive value.

22. A memory device, comprising:
 a selected memory cell having a logic value;
 a reference memory cell;
 a biasing circuit that biases the selected and reference memory cells and thereby modifies current-conduction states of the memory cells at first and second instants, respectively;
 a comparator circuit that produces first and second signals indicative of the first and second instants, respectively;
 a time-shifting circuit that time-shifts one of the first and second signals to produce a time-shifted signal; and
 a logic unit that determines the logic value of the selected memory cell based on a temporal relation between the time-shifted signal and one of the first and second signals that was not time-shifted by the time-shifting circuit.

23. The memory device of claim 22 wherein the comparator circuit includes:
 a first comparator having a first input receiving a cell current of the selected memory cell, a second input receiving a comparison current, and an output that produces the first signal; and
 a second comparator having a first input receiving a reference current of the reference memory cell, a second input receiving the comparison current, and an output that produces the second signal.

24. The memory device of claim 22 wherein the biasing circuit is a voltage ramp biasing circuit that applies a voltage ramp to the memory cells.

25. The memory device of claim 22 wherein the time-shifting circuit includes a delay unit having an input coupled to the one of the first and second signals being time-shifted and an output that outputs the time-shifted signal.

26. The memory device of claim 22 wherein the first and second signals are digital signals and the time-shifting circuit includes an adder having an input coupled to the one of the first and second signals being time-shifted and an output that outputs the time-shifted signal, the adder being structured to add a digital offset value to the one of the first and second signals being time-shifted.

27. The memory device of claim 26 wherein the digital offset value is a positive value.

\* \* \* \* \*